(12) United States Patent
Takemura et al.

(10) Patent No.: US 11,221,381 B2
(45) Date of Patent: Jan. 11, 2022

(54) MEASUREMENT DEVICE HAVING A MICROWAVE GENERATOR IN WHICH A CAPACITOR IS FORMED BY COIL LEGS

(71) Applicant: SUMIDA CORPORATION, Tokyo (JP)

(72) Inventors: Yuki Takemura, Natori (JP); Yoshiharu Yoshii, Natori (JP); Masaki Saito, Ueda (JP)

(73) Assignee: SUMIDA CORPORATION

( * ) Notice: Subject to any disclaimer, the term of this patent is extended or adjusted under 35 U.S.C. 154(b) by 30 days.

(21) Appl. No.: 16/783,847

(22) Filed: Feb. 6, 2020

(65) Prior Publication Data

US 2020/0271735 A1 Aug. 27, 2020

(51) Int. Cl.
*G01R 33/26* (2006.01)
(52) U.S. Cl.
CPC .................................. *G01R 33/26* (2013.01)
(58) Field of Classification Search
CPC ...... G01R 33/26; G01R 33/323; G01R 33/36; G01R 33/3628; G01R 33/60; G01N 24/10
See application file for complete search history.

(56) References Cited

U.S. PATENT DOCUMENTS

| 2019/0079157 A1* | 3/2019 | Yoshii | G01N 24/10 |
| 2019/0252842 A1* | 8/2019 | Breeze | B82Y 10/00 |

FOREIGN PATENT DOCUMENTS

| JP | 2012-110489 A | 6/2012 |
| JP | 2019-053025 A | 4/2019 |
| WO | 2015-175047 A2 | 11/2015 |

OTHER PUBLICATIONS

Extended European Search Report for corresponding Application No. EP 20158300.2 dated Jul. 14, 2020 (11 pages).
Chipaux, Mayeul et al., "Magnetic Imaging With an Ensemble of Nitrogen-Vacancy Centers in Diamond", European Physical Journal D: Atoms, Molecules, Clusters Andoptical Physics, vol. 69, No. 7, Jul. 2, 2015, pp. 1-10 (XP035892264).

(Continued)

*Primary Examiner* — Jay Patidar
(74) *Attorney, Agent, or Firm* — Harness, Dickey & Pierce, P.L.C.

(57) ABSTRACT

A measurement device includes a microwave generator, an electron spin resonance member, and an observation system. The microwave generator is configured to generate a microwave. The microwave is configured for an electron spin quantum operation based on a Rabi oscillation. The microwave generator has a coil configured to emit the microwave and an electrostatic capacitance member electrically connected in parallel to the coil. The microwave is irradiated to the electron spin resonance member. The observation system is configured to measure a physical quantity in a measured field in response to a state of the electron spin resonance member when the electron spin resonance member is irradiated by the microwave. The electrostatic capacitance member is directly connected to the coil or is arranged between the coil and an electric element that is electrically connected to the coil.

16 Claims, 12 Drawing Sheets

(56) References Cited

OTHER PUBLICATIONS

Herrmann, Johannes et al., "Polarization-And Frequency-Tunable Microwave Circuit for Selective Excitation of Nitrogen-Vacancy Spins in Diamond", Applied Physics Letters, AIP Publishing LLC, US., vol. 109, No. 18, Nov. 3, 2016, 4 pages—the whole document (XP012213218).
Sasaki et al., "Broadband, Large-Area Microwave Antenna for Optically-Detected Magnetic Resonance of Nitrogen-Vacancy Centers in Diamond", arxiv.org, Cornell University Library, 201 Olin Library, Cornell University, Ithaca, NY, May 16, 2016, 6 pages (XP080701276).
Twig et al., "Sensitive Surface Loop-Gap Microresonators for Electron Spin Resonance", Review of Scientific Instruments, AIP, Melville, NY, US, vol. 81, No. 10, Oct. 21, 2010, pp. 104703-104703 (XP012145495).

\* cited by examiner

| Electrostatic Capacitance [pF] (Electrostatic Capacitance Member 2b) | Inductance [nH] (Frequency Adjustment Unit 22) | Electrostatic Capacitance [pF] (Frequency Adjustment Unit 22) | Microwave Frequency [GHz] | Reflection Loss [dB] | Mean Magnetic Flux Density [G] | Standardized Mean Magnetic Flux Density [G] |
|---|---|---|---|---|---|---|
| Not Provided | 18.4 | 0.08 | 2.860 | -11.9 | 1.93 | 2.23 |
| 0.05 | 18.4 | 0.05 | 2.844 | -16.1 | 2.26 | 2.46 |
| 0.10 | 10.9 | 0.05 | 2.850 | -13.8 | 2.48 | 2.78 |
| 0.15 | 12.1 | 0 | 2.844 | -21.7 | 2.71 | 2.83 |

Fig. 6

MEASUREMENT DEVICE HAVING A MICROWAVE GENERATOR IN WHICH A CAPACITOR IS FORMED BY COIL LEGS

CROSS-REFERENCE TO RELATED APPLICATIONS

This application claims priority to Japanese Patent Application No. 2019-031070 filed Feb. 22, 2019, which is hereby expressly incorporated by reference herein in its entirety.

BACKGROUND

1. Technical Field

The present invention relates to a measurement device.

2. Related Art

A conventional magnetic measurement device measures a magnetic field by using an optically detected magnetic resonance (ODMR) in which an electron spin resonance is utilized. For example, please refer to Japanese Patent Publication Number 2012-110489.

With respect to the ODMR, a high frequency magnetic field (a microwave) and a light are irradiated to a medium that has a sub-level and an optical transition level. The medium is an electron spin resonance member. As a result, because an occupying number of electrons is changed by the magnetic resonance between the sub-levels, such change is detected with high sensitivity by an optical signal.

For instance, with respect to nitrogen and a lattice defect (NVC: nitrogen vacancy center) in a diamond structure, typically, after an electron in a ground state is excited with a green light, the electron emits a red light when the electron in the excited state returns to the ground state. On the other hand, when a high frequency magnetic field of around 2.87 GHz is irradiated to an electron, the electron transits from the lowest sub-level (ms=0) to the remaining sub-levels (ms=±1) having a high energy level among the three sub-levels in the ground state. When the electron in the sub-levels (ms=±1) is excited with a green light, the electron returns to the sub-level (ms=0) in the ground state without radiation. Note that "ms" means a spin magnetic quantum number. As a result, the light emission quantity is decreased.

Further, because of, such as, the Zeeman effect in a measured magnetic field (a field in which a strength of a physical quantity, a magnetic field, is measured) and the Stark effect in a measured electric field (a field in which a strength of a physical quantity, an electric field, is measured), the sub-levels (ms=±1) having the high energy level fluctuates. A fluorescence quantity that is observed with the ODMR is decreased because of a microwave frequency corresponding to the fluctuated sub-levels (ms=±1). Thus, a strength or an intensity of a physical quantity (such as a magnetic field or an electric field) of the measured field (a field in which a strength of a physical quantity is measured) (measured place) is specified (measured) by measuring a distribution of the fluorescence quantities.

With respect to the measurement system discussed above that is not limited to the ODMR, when an electron spin quantum operation is performed in a relatively short period of time, the intensity of the microwave needs to be enhanced. Specifically, the measurement system is, for instance, to perform the electron spin quantum operation (for example, the transition between the sub-levels of the electron spin explained above) based on the Rabi oscillation by irradiating the microwave. That is, the intensity of the microwave needs to be enhanced in order to shorten the measurement time of the magnetic field. However, it is difficult to enhance the intensity of the microwave with respect to the magnetic measurement device explained above. As a result, it is difficult to measure the magnetic field in a relatively short period of time.

SUMMARY

The present invention attempts to solve the above problems. An object of the present invention is to provide a measurement device that enables performing a magnetic field measurement or an electric field measurement in a relatively short period of time by utilizing an electron spin quantum operation based on the Rabi oscillation by irradiating a microwave.

According to one aspect of the present invention, a measurement device includes a microwave generator, an electron spin resonance member, and an observation system. The microwave generator is configured to generate a microwave. The microwave is configured to be used for an electron spin quantum operation based on a Rabi oscillation. The microwave generator has a coil configured to emit the microwave and an electrostatic capacitance member electrically connected in parallel to the coil. The microwave is irradiated to the electron spin resonance member. The observation system is configured to measure a physical quantity in a measured field in response to a state of the electron spin resonance member when the electron spin resonance member is irradiated by the microwave. The electrostatic capacitance member is directly connected to the coil or is arranged between the coil and an electric element that is electrically connected to the coil.

According to the present invention, a measurement device that enables performing a magnetic field measurement or an electric field measurement by utilizing an electron spin quantum operation based on the Rabi oscillation by irradiating the microwave in a relatively short period of time can be obtained.

BRIEF DESCRIPTION OF THE DRAWINGS

FIG. 3A is a front view of the microwave generation unit 2. FIG. 3B is a side view of the microwave generation unit 2.

FIG. 6 is a table for explaining an enhancement of a magnetic flux density due to a microwave generated by the microwave generation unit 2 according to the first embodiment of the present invention.

DESCRIPTION OF EXEMPLARY EMBODIMENTS

As discussed below, embodiments according to the present invention are explained with reference to the drawings.

First Embodiment

Figure 1:
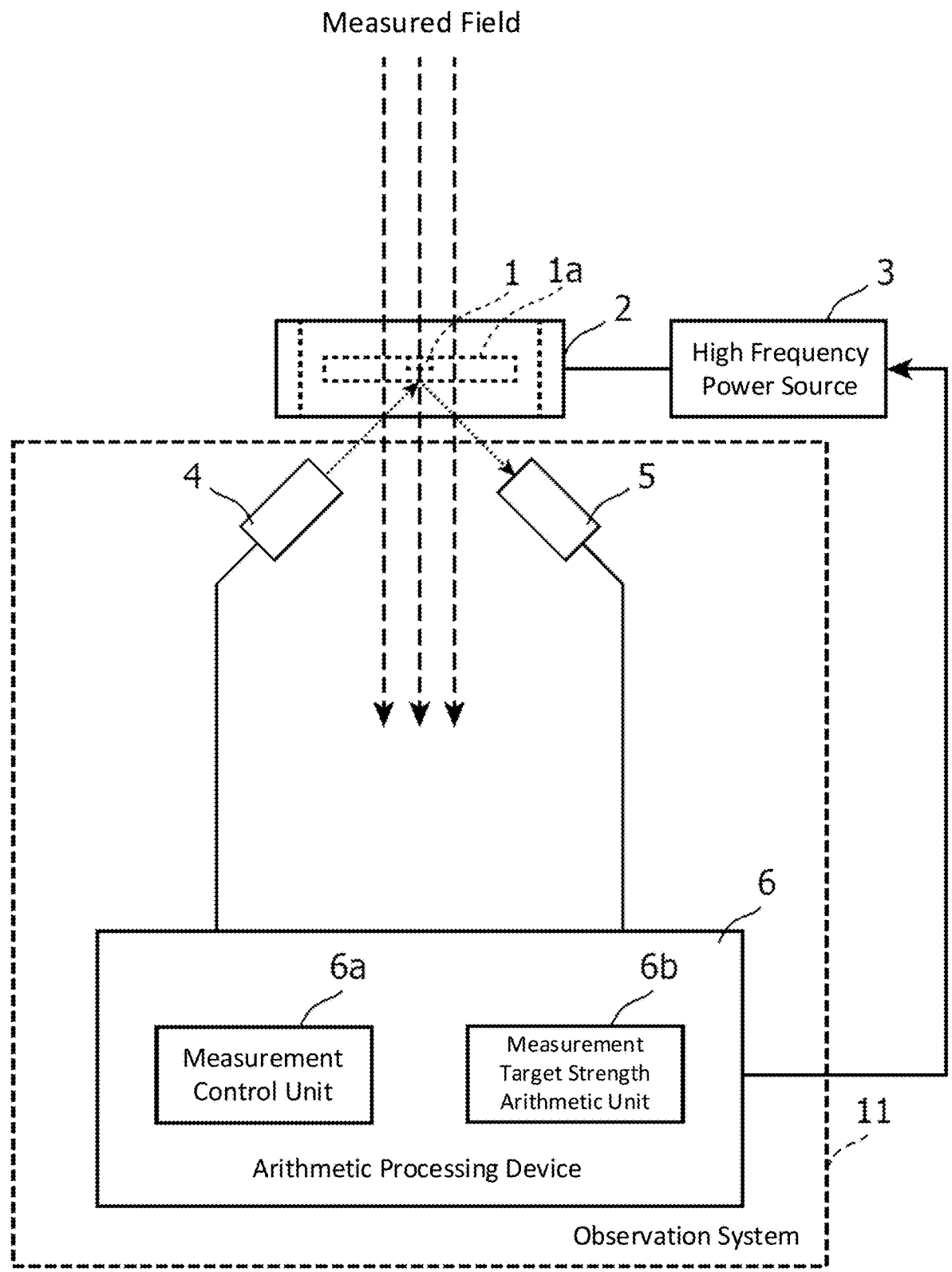
FIG. 1 is a schematic view that shows a configuration of a measurement device according to a first embodiment of the present invention.

FIG. 1 is a schematic view that shows a configuration of a measurement device according to a first embodiment of the present invention. As an example, the measurement device according to the first embodiment and other embodiments of the present invention measures a physical quantity, such as an intensity (strength) of a magnetic field or an electric field, in a measured field (a field in which the intensity of the physical quantity is measured, such as a measured magnetic field or a measured electric field) by an optically (light) detected magnetic resonance method. The measurement device shown in FIG. 1 has an electron spin resonance member 1. The electron spin resonance member 1 is provided in a measured field (a magnetic field in which a strength thereof is measured or an electric field in which a strength thereof is measured). As explained below, an electron spin quantum operation based on the Rabi oscillation is applied to the electron spin resonance member 1 according to a predetermined measurement sequence.

Further, the measurement method of the measured field is not limited to the optically detected magnetic resonance method. As long as the electron spin quantum operation based on the Rabi oscillation is utilized, other methods may be adopted. Further, in the embodiments of the present invention, the electron spin resonance member 1 is a plate member of, for instance, a diamond that has the NVC (nitrogen vacancy center) for the optically detected magnetic resonance method and is fixed to a support plate 1a. The electron spin resonance member 1 for the optically detected magnetic resonance method is not limited to the diamond plate member that has the NVC and may be another medium that has a color center.

The measurement device shown in FIG. 1 further has a microwave generation unit (microwave generator) 2 and a high frequency power source 3.

The microwave generation unit 2 generates a microwave. The microwave is used to apply the electron spin quantum operation based on the Rabi oscillation with respect to the electron spin resonance member 1.

In the first embodiment of the present invention, the microwave generation unit 2 applies a microwave magnetic field to the electron spin resonance member 1. A frequency of the microwave is set according to the type of the electron spin resonance member 1. For instance, when the electron spin resonance member 1 is diamond that has the NVC, the microwave generation unit 2 applies the microwave magnetic field of around 2.87 GHz to the diamond having the NVC as the electron spin resonance member 1. The high frequency power source 3 supplies a current for generating the microwave to the microwave generation unit 2. In other words, the high frequency power source 3 supplies the current for generating the microwave magnetic field explained above.

Further, the measurement device shown in FIG. 1 has an observation system 11. The observation system 11 is, for instance, configured with an irradiation device 4, a light receiving device 5, and an arithmetic processing device (processing device) 6. The observation system 11 measures (specifies) the physical quantity, such as the intensity (strength) of the physical quantity in the measured field by utilizing the electron spin resonance member 1 to which the microwave explained above is irradiated.

The irradiation device 4 irradiates lights (including an excitation light having a predetermined wavelength and a measuring light having a predetermined wavelength) to the electron spin resonance member 1. The light receiving device 5 detects a fluorescence that is emitted from the electron spin resonance member 1 when the measuring light is irradiated on the electron spin resonance member 1.

The arithmetic processing device 6 has, for instance, a computer having a processor (CPU) and a memory. The processor in the computer executes a program stored in the memory so as to perform various processing operations. In the embodiments of the present invention, the arithmetic processing device 6 performs as a measurement control unit 6a and a measurement target strength (intensity) calculation unit 6b.

The measurement control unit 6a executes a predetermined measurement sequence with respect to the measured field. Specifically, the measurement control unit 6a controls the high frequency power source 3 and the irradiation device 4 according to the measurement sequence and specifies (determines) the detected light quantity of the fluorescence that is detected by the light receiving device 5. For instance, the irradiation device 4 has, for example, a laser diode as a light source. The light receiving device 5 has, for example, a photodiode as a photodetector. The measurement control unit 6a determines the detected light quantity explained above based on an output signal from the light receiving device 5 that is obtained by, for example, amplifying an output signal from the photodetector (photodiode). In the embodiments of the present invention, for example, the Ramsey pulse sequence and the Spin Echo sequence are applied as the predetermined measurement sequence explained above. However, the predetermined measurement sequence is not limited to these sequences.

The measurement target strength calculation unit 6b calculates the physical quantity, such as the intensity (strength) of the physical quantity in the measured field (an intensity (strength) of a measured magnetic field or a measured electric field) based on the detected light quantity detected by the measurement control unit 6a explained above according to a predetermined operation expression. The strength (intensity) of the physical quantity is, for instance, an amplitude of the magnetic flux density in the measured field.

Figure 2:
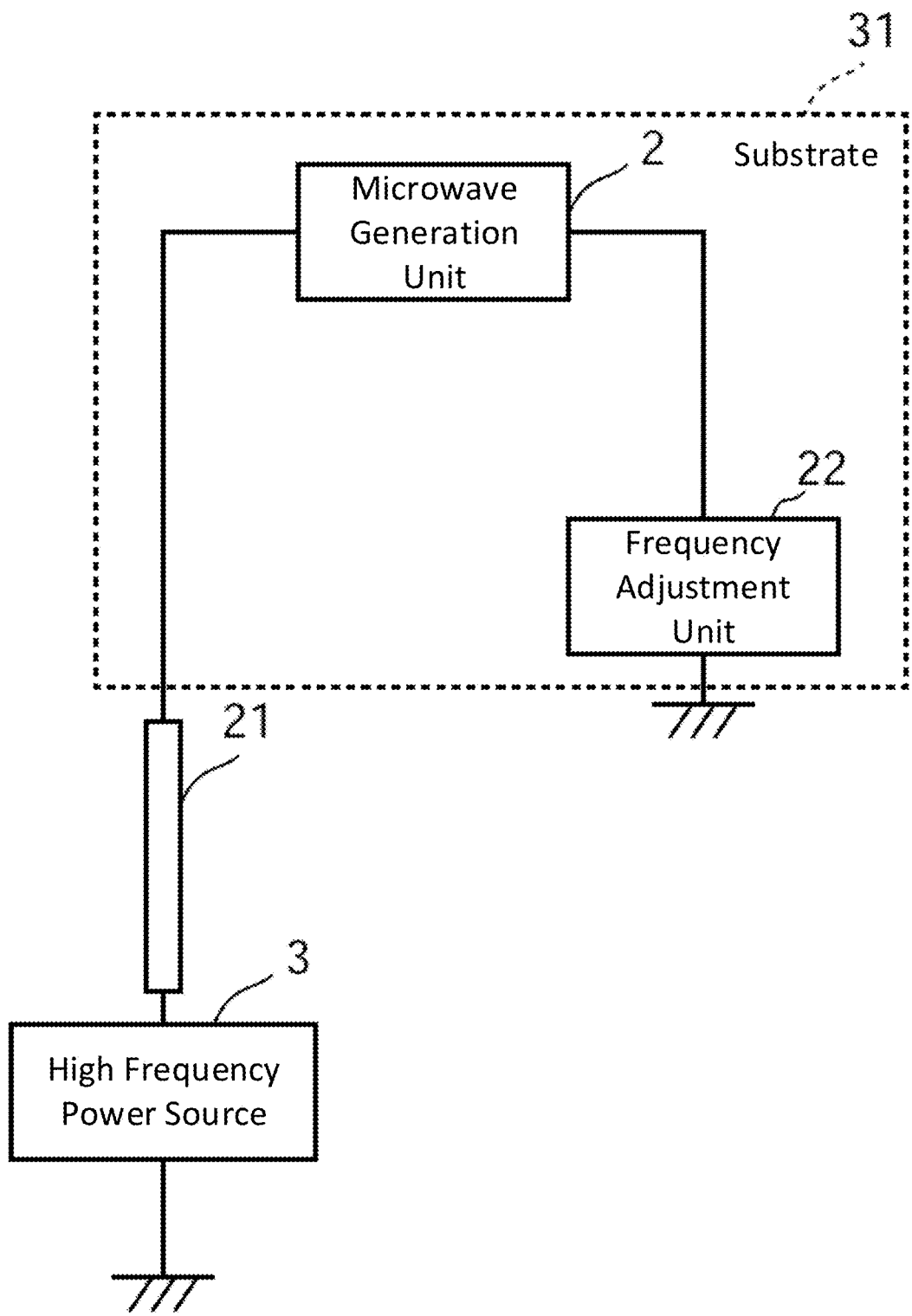
FIG. 2 is a block diagram that shows an example of an electric circuit around a microwave generation unit (microwave generator) 2 and a high frequency power source 3 of the measurement device shown in FIG. 1 according to the first embodiment of the present invention.

FIG. 2 is a block diagram that shows an example of an electric circuit around the microwave generation unit 2 and the high frequency power source 3 of the measurement device shown in FIG. 1.

For instance, as shown in FIG. 2, the high frequency power source 3 is electrically connected to a terminal or an electrode (not shown) on or in a substrate (board) 31 via a transmission line member 21. The microwave generation unit 2 is attached to the substrate 31. The current for generating the microwave is supplied to the microwave generation unit 2 from the high frequency power source 3 via the transmission line member 21 and the terminal or electrode on or in the substrate 31. In other words, the transmission line member 21 is, for example, a wiring pattern on the substrate 31. Further, a frequency adjustment unit (frequency adjuster) 22 and an impedance matching unit (not shown) and the like are electrically connected to the microwave generation unit 2 in series. In addition, the frequency adjustment unit 22 and the impedance matching part (not shown) and the like are mounted on the substrate 31. The frequency adjustment unit 22 is, for instance, a series LC circuit.

Figure 3A:
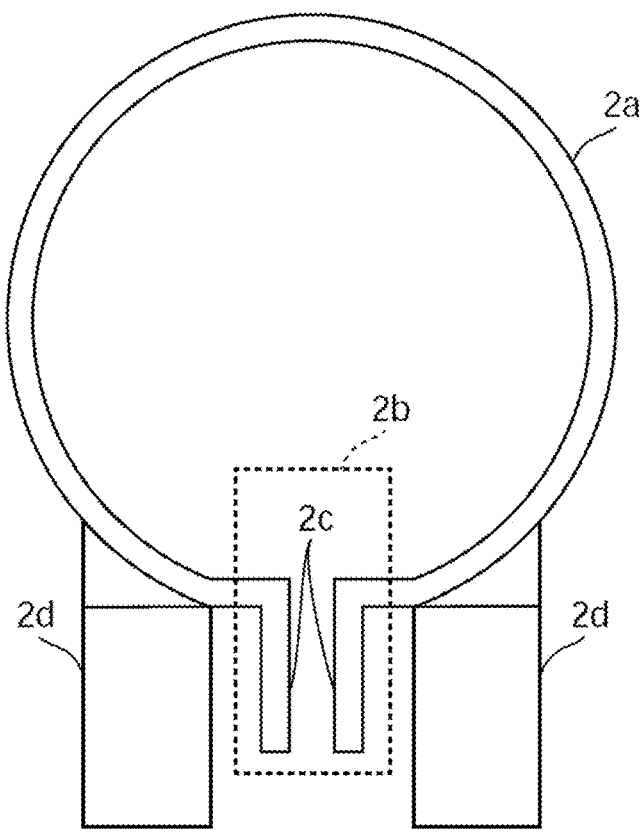
FIGS. 3A and 3B are schematic views that show examples of the microwave generation unit 2 of the measurement device according to the first embodiment of the present invention.
Figure 3B:
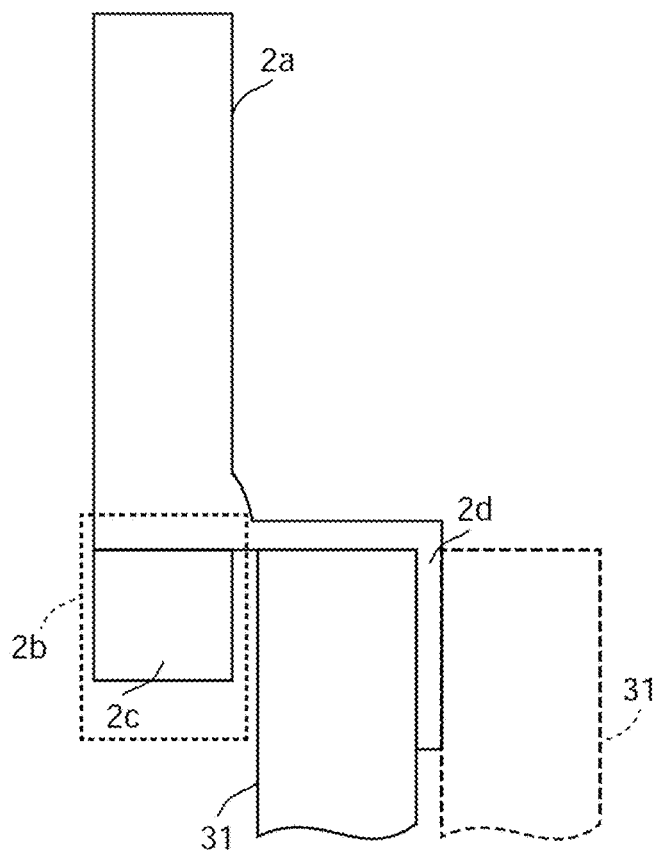

FIGS. 3A and 3B are schematic views that show examples of the microwave generation unit 2 of the measurement device according to the first embodiment of the present invention. FIG. 3A is a front view of the microwave generation unit 2 according to the first embodiment of the present invention. FIG. 3B is a side view of the microwave generation unit 2 according to the first embodiment of the present invention.

The microwave generation unit 2 has a coil part 2a that is formed into a substantially circular shape and an additional electrostatic capacitance member 2b. Specifically, the coil part 2a emits the microwave. The additional electrostatic capacitance member 2b is provided electrically in parallel to the coil part 2a.

The coil part(s) 2a sandwiches or surrounds the electron spin resonance member 1 or is located at only one side of the electron spin resonance member 1 as exemplarily shown in the applicant's patent publication, JP 2019-53025. Further, if the coil part 2a is configured with two coil parts 2a, the coil parts 2a emit the microwaves by conducting two current flows in two coil parts 2a that are parallel to each other at a predetermined distance. The coil part 2a may be formed as two linearly extending bars (strips) (See the third embodiment below) and may also be formed as a single plate. Further, even when the coil part 2a is a single plate, the current for generating the microwave flows in both end surface parts of the coil part 2a because of a skin (surface) effect. As a result, two current flows are concentrated at the end of the plate (the coil part 2a) at a high current frequency, such as a frequency is more than 1 MHz.

In the first embodiment, as shown in FIGS. 3A and 3B, the coil part 2a is formed as a single plate.

Further, in the first embodiment, as shown with the solid lines in FIG. 3B, the microwave generation unit 2 (the coil part 2a) is mounted at the end (edge) of the substrate 31. Further, the microwave generation unit 2 (the additional electrostatic capacitance member 2b) may also be mounted at the end (edge) of the substrate 31 as shown with the broken lines in FIG. 3B.

Figure 4:
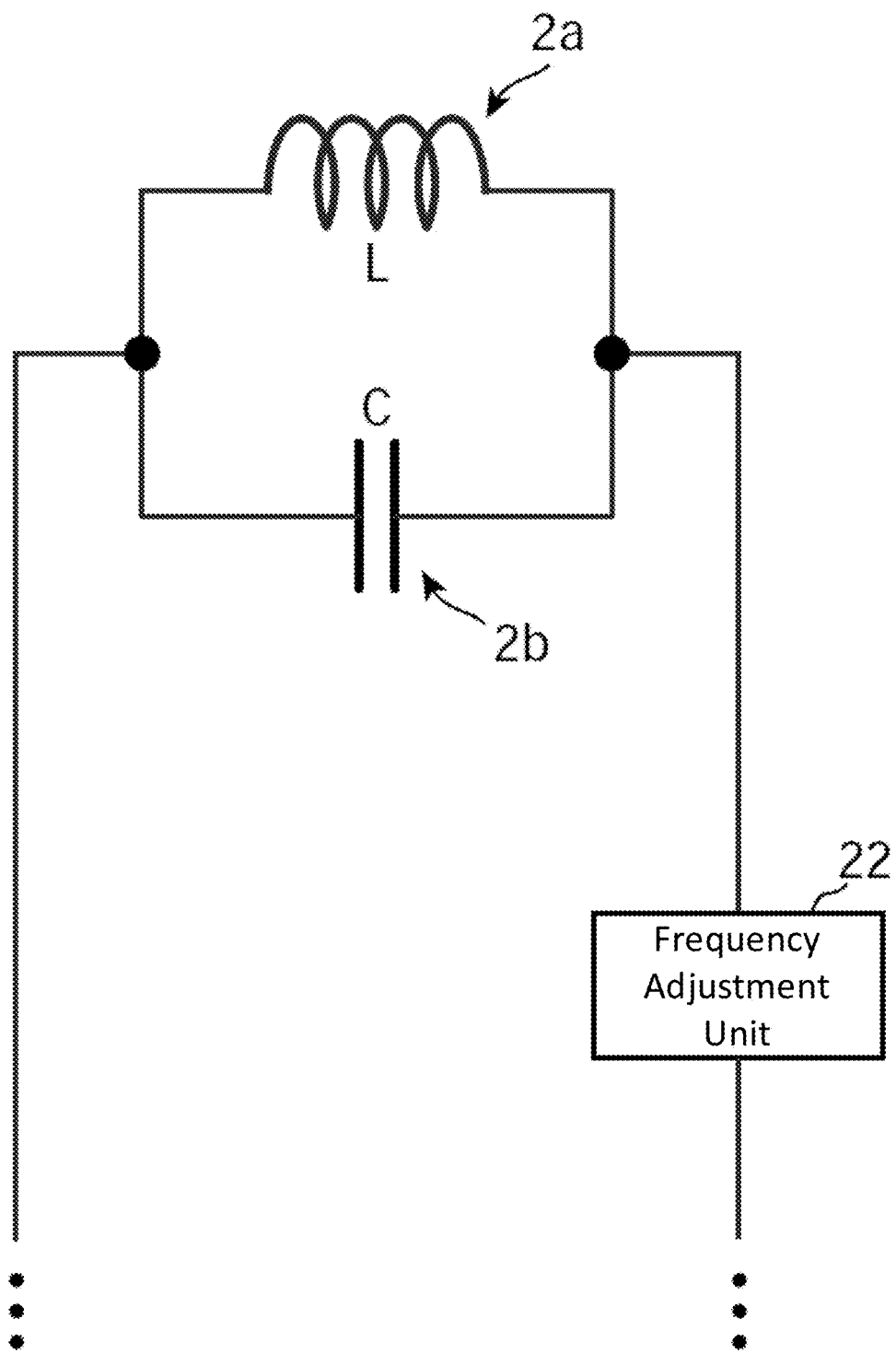
FIG. 4 is a circuit diagram that shows an equivalent circuit of the microwave generation unit 2 of the measurement device shown in FIG. 1 according to the first embodiment of the present invention.

FIG. 4 is a circuit diagram that shows an equivalent circuit of the microwave generation unit 2 of the measurement device shown in FIG. 1 according to the first embodiment of the present invention.

The additional electrostatic capacitance member 2b is provided in order to enhance the output of the microwave. Specifically, as shown in FIG. 4, the additional electrostatic capacitance member 2b is an electrostatic capacitance that is additionally provided to be connected to the coil part 2a in parallel. Further, the additional electrostatic capacitance member 2b is not a stray electrostatic capacitance and is intendedly provided so as to have a predetermined electrostatic capacitance value.

Here, the frequency adjustment unit 22 is provided to adjust the frequency of the microwave to a predetermined frequency by restraining (suppressing) a frequency change of the frequency of the microwave due to the additional electrostatic capacitance member 2b.

The additional electrostatic capacitance member 2b is directly connected to the coil part 2a. Alternatively, the additional electrostatic capacitance member 2b is arranged between the coil part 2a and an electric element (for instance, the frequency adjustment unit 22 and/or the impedance matching part) that is electrically connected to the coil part 2a.

In the first embodiment, the additional electrostatic capacitance member 2b is directly provided at the coil part 2a. In other words, the additional electrostatic capacitance member 2b and the coil part 2a are integrally formed as a monolithic (or integrated) member. Alternatively, the additional electrostatic capacitance member 2b and the coil part 2a are formed as separate members that are directly connected to each other. Further, the additional electrostatic capacitance member 2b has a pair of electrode pieces 2c that extend from the ends of the coil part 2a. The electrode pieces 2c extend from the ends of the coil part 2a by a predetermined length in a direction substantially along the circumference of the coil part 2a. Then, the electrode pieces 2c have plate parts that are respectively bent toward an outside of the coil part 2a approximately vertically (in a radial direction of the coil part 2a). The plate parts of the electrode pieces 2c face each other with an air gap therebetween. An electrostatic capacitance of the additional electrostatic capacitance member 2b is set based on a distance of the gap and the areas of the plate parts.

Further, as shown in FIGS. 3A and 3B, the microwave generation unit 2 has a pair of connecting legs 2d that extend from both ends of the coil part 2a.

Figure 5:
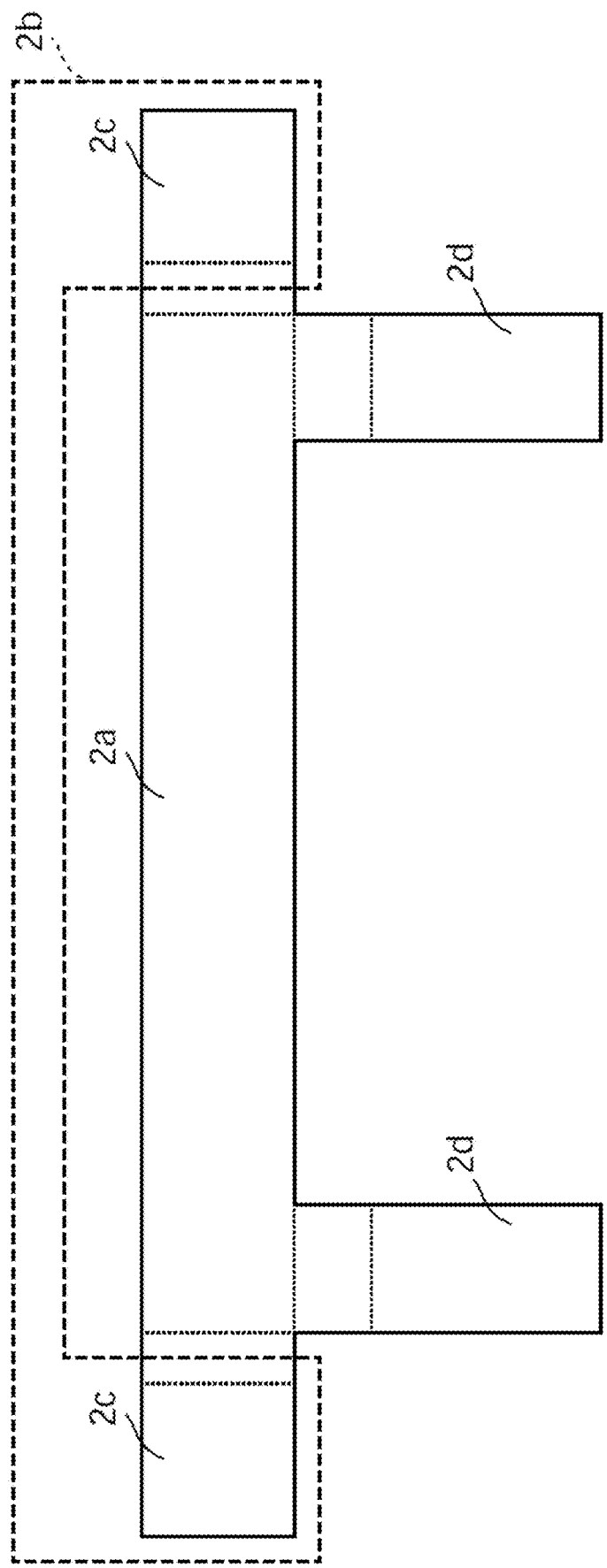
FIG. 5 is a pre-processed view that shows the microwave generation unit 2 shown in FIGS. 3A and 3B according to the first embodiment of the present invention.

FIG. 5 is a pre-processed view that shows the microwave generation unit 2 shown in FIGS. 3A and 3B according to the first embodiment of the present invention. For instance, as shown in FIG. 5, the coil part 2a and the pair of electrode pieces 2c (in addition, the pair of connecting legs 2d) are obtained by forming (deforming) a monolithic conductive plate.

Next, the operation of the measurement device according to the first embodiment of the present invention will be explained.

According to the predetermined measurement sequence, the measurement control unit 6a performs:

(a) firstly, irradiating an excitation light having a predetermined wavelength to the electron spin resonance member 1 from the irradiation device 4 so as to arrange (set up) a state of the electron spin of the electron spin resonance member 1;

(b) secondly, after the irradiation of the excitation light, applying a pulsed microwave at a predetermined time and a predetermined time interval to the electron spin resonance member 1 by the microwave generation unit 2 and the high frequency power source 3; and (c) thirdly, after the application of the pulsed microwave, irradiating a measuring light for a projection measurement to the electron spin resonance member 1 from the irradiation device 4, and at the same time, receiving the fluorescence that is emitted by the electron spin resonance member 1 by the light receiving device 5, and detecting the light receiving quantity (the detected light quantity). Thereafter, the measurement target strength calculation unit 6b calculates the strength (intensity) of a physical quantity, such as a magnetic field or an electric field, in the measured field based on the detected light quantity.

With respect to the measurement sequence explained above, when the microwave generation unit 2 generates the microwave, energy W being accumulated in the microwave generation unit 2 is indicated by the following formula.

$$W = Wh + We$$

In the formula above, the "Wh" indicates magnetic energy that is accumulated in the coil part 2a and is proportional to an inductance L of the coil part 2a. Further, the "We" indicates electric energy that is accumulated in the additional electrostatic capacitance member 2b and is proportional to an electrostatic capacitance "C" of the additional electrostatic capacitance member 2b.

The "Wh" and "We" have the same frequency corresponding to the frequency of the microwave and alternate with each other and with a phase difference thereof at substantially 90 degrees. The strength (intensity) of the microwave is made higher as the "W" becomes larger. Therefore, the strength (intensity) of the microwave is enhanced by providing (adding) the additional electrostatic capacitance member 2b.

Further, because the strength (intensity) of the microwave becomes higher, the electron spin quantum operation is performed in a short period of time. As a result, the time required for measuring or specifying a strength (intensity) of the magnetic field (the magnetic field measurement) or the electric field (the electric field measurement) becomes shorter.

As explained above, according to the first embodiment, the microwave generation unit 2 generates the microwave for performing the electron spin quantum operation based on the Rabi oscillation. The observation system 11 measures (specifies) the strength (intensity) of the physical quantity in the measured field by utilizing the electron spin resonance member 1 to which the microwave is irradiated. The microwave generation unit 2 has the coil part 2a that emits the microwave and the additional electrostatic capacitance member 2b. Specifically, the additional electrostatic capacitance member 2b is electrically connected in parallel to the coil part 2a. The additional electrostatic capacitance member 2b is directly connected to the coil part 2a. Alternatively, the additional electrostatic capacitance member 2b is arranged between the coil part 2a and the electric element that is electrically connected to the coil part 2a.

As a result, since the output of the microwave is enhanced, the magnetic field measurement and the electric field measurement by utilizing the electron spin quantum operation based on the Rabi oscillation by irradiating the microwave are performed in a relatively short period of time.

FIG. 6 is a table for explaining an enhancement of a magnetic flux density due to the microwave generated by the microwave generation unit 2 according to the first embodiment of the present invention. FIG. 6 shows a simulation result when the frequency adjustment unit 22 makes the frequency of the microwave approximate to or close to 2.85 GHz under the condition in which a radius of the coil part 2a is 2.0 mm and a width (the width of the plate-shaped coil) of the coil part 2a is 1.5 mm. Specifically, as shown in FIG. 6, as compared with a case in which the additional electrostatic capacitance member 2b is not provided (the top row), the mean magnetic flux densities of the coil part 2a increase because of the existence of the additional electrostatic capacitance member 2b (other three rows). Further, the standardized average magnetic flux density is obtained by the standardization of the mean magnetic flux density by the reflection loss.

Second Embodiment

Figure 7:
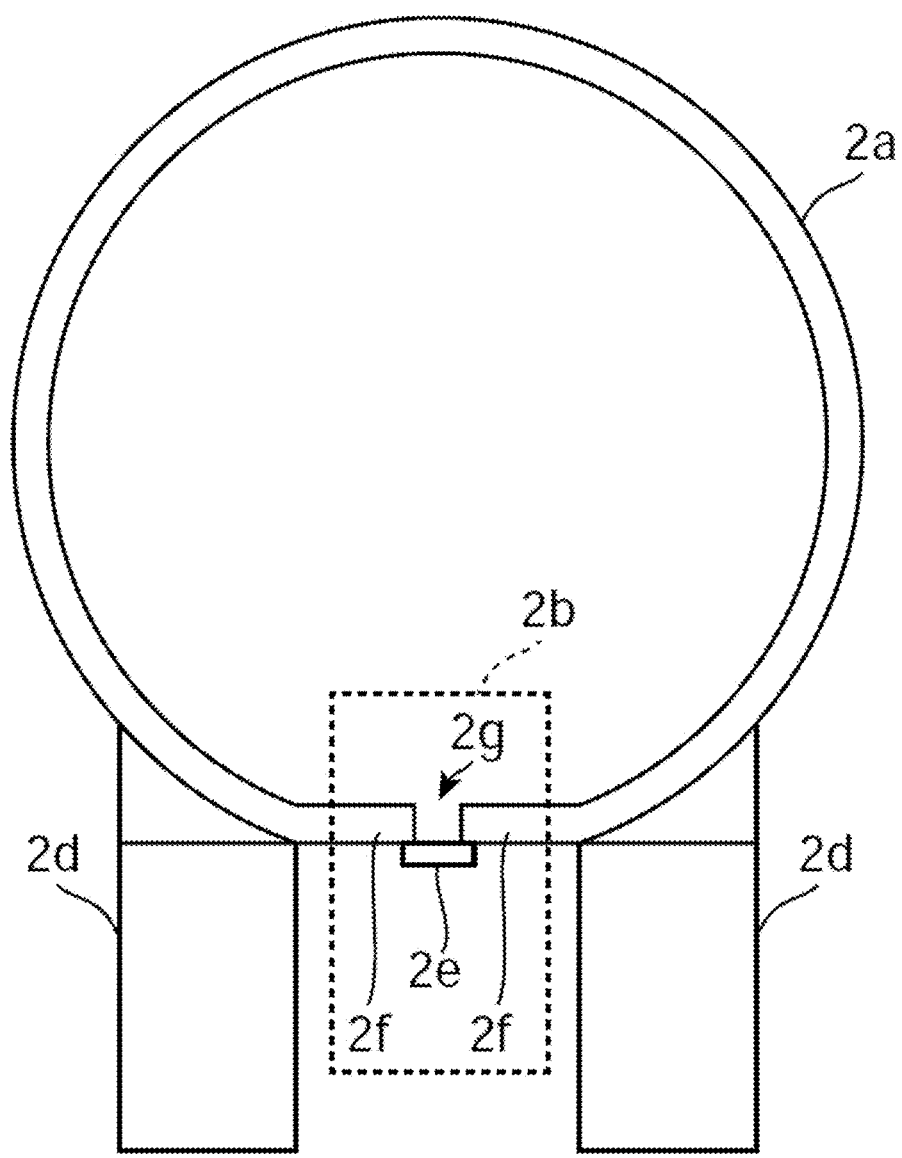
FIG. 7 is a schematic view that shows an example of a microwave generation unit 2 of a measurement device according to a second embodiment of the present invention.

FIG. 7 is a schematic view that shows an example of the microwave generation unit 2 of the measurement device according to a second embodiment of the present invention. In the second embodiment, the additional electrostatic capacitance member 2b has an electrostatic capacitance element 2e that is electronically connected to the coil part 2a. The electrostatic capacitance element 2e is, for instance, a miniature (small) chip type capacitor. Further, both terminals of the electrostatic capacitance element 2e are electronically and mechanically (physically) connected to a pair of terminal strips 2f, respectively. The pair of terminal strips 2f respectively extend from the ends of the coil part 2a in a direction substantially along the circumference of the coil part 2a.

Explanations with respect to other configurations and operations of the measurement device according to the second embodiment are omitted because they are the same as the first embodiment. Thus, please refer to the first embodiment for the other configurations and operations of the measurement device according to the second embodiment.

Figure 8:
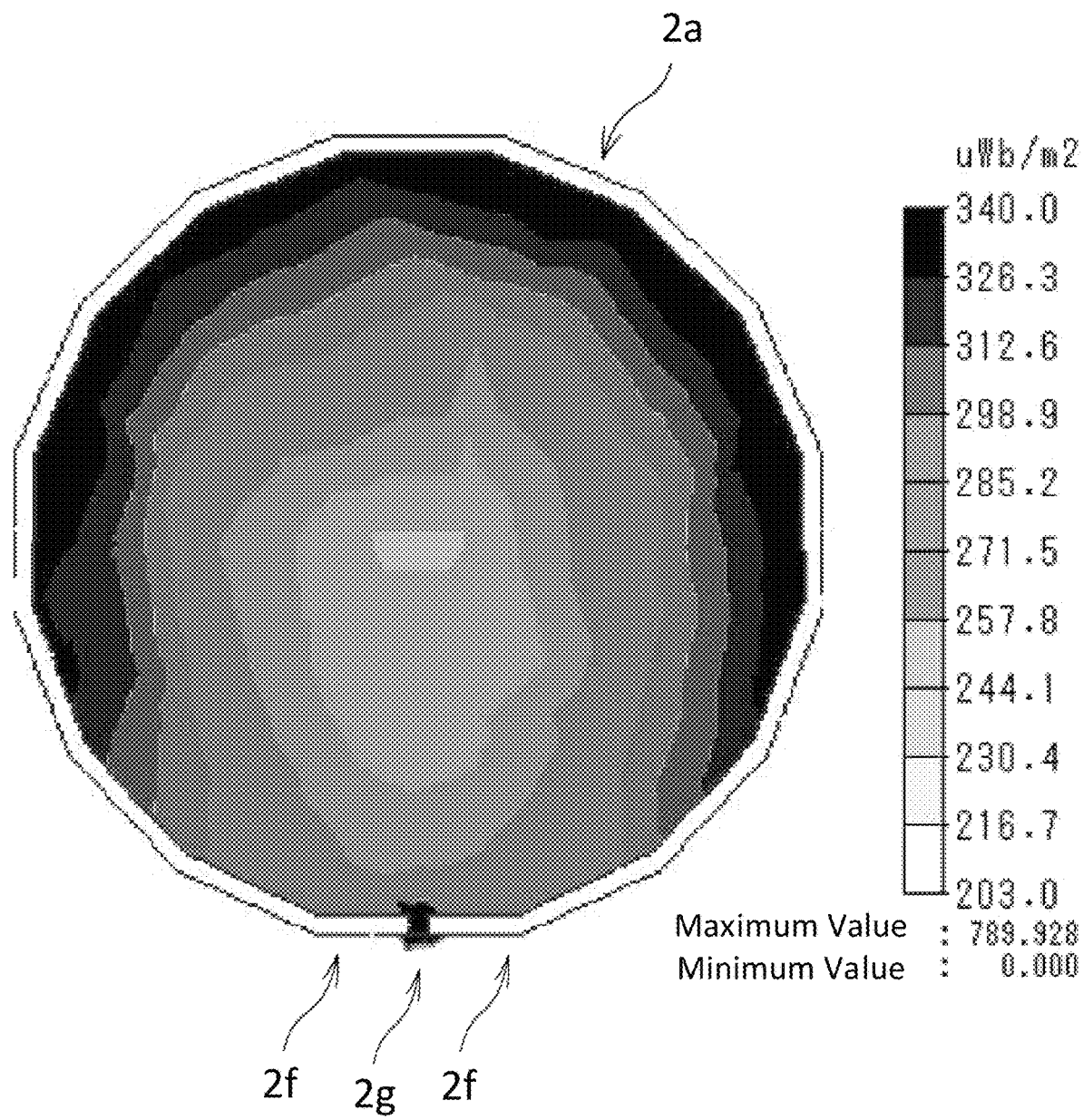
FIG. 8 is a diagram for explaining a magnetic flux density distribution of the microwave generation unit 2 according to the second embodiment of the present invention.

FIG. 8 is a diagram for explaining a magnetic flux density distribution of the microwave generation unit 2 according to the second embodiment of the present invention. FIG. 8 shows a simulation result of the magnetic flux density distribution. As shown in FIG. 8, a gap 2g between the ends of the coil part 2a that is formed into a circular shape becomes narrow by the pair of terminal strips 2f. See also FIG. 7. As a result, the magnetic flux density distribution along the circumference of the coil part 2a is uniform.

Third Embodiment

Figure 9:
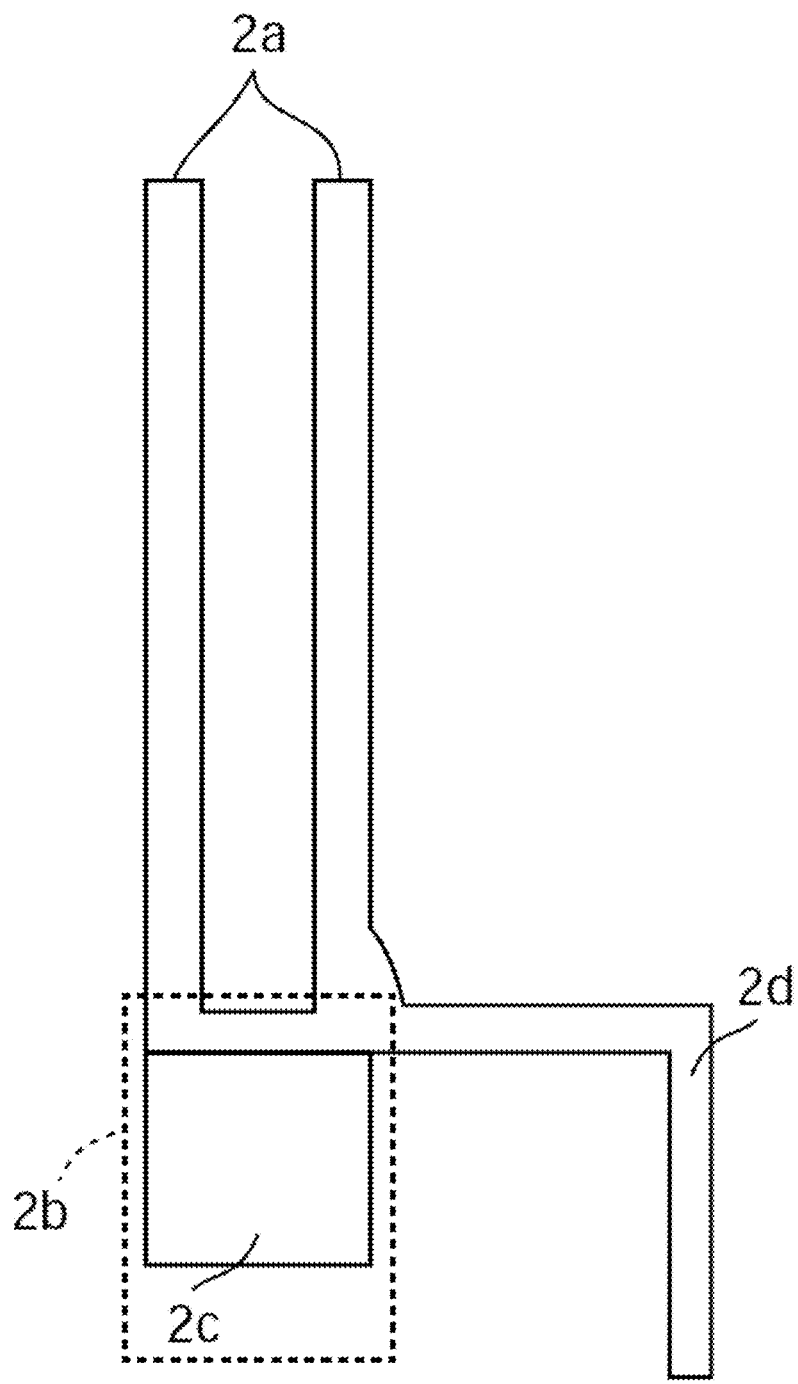
FIG. 9 is a schematic view that shows an example of a microwave generation unit 2 of a measurement device according to a third embodiment of the present invention.

FIG. 9 is a schematic view that shows an example of the microwave generation unit 2 of the measurement device according to a third embodiment of the present invention. In the third embodiment, the coil part 2a is formed as two linearly extending bars (strips) (bar coils or strip coils). Further, in the third embodiment, a single common additional electrostatic capacitance member 2b for the two linearly extending bars (strips) (bar coils or strip coils) of the coil part 2a is provided. However, two separate additional electrostatic capacitance members 2b for the two linearly extending bars (strips) (bar coils or strip coils) of the coil part 2a may also be provided, respectively.

Explanations with respect to other configurations and operations of the measurement device according to the third embodiment are omitted because they are the same as the first embodiment. Further, with respect to the third embodiment, the additional electrostatic capacitance member 2b may also have the same configuration as the second embodiment. Thus, please refer to the first embodiment for the other configurations and operations of the measurement device of the third embodiment and also refer to the second embodiment for the additional electrostatic capacitance member 2b of the third embodiment.

Fourth Embodiment

Figure 10:
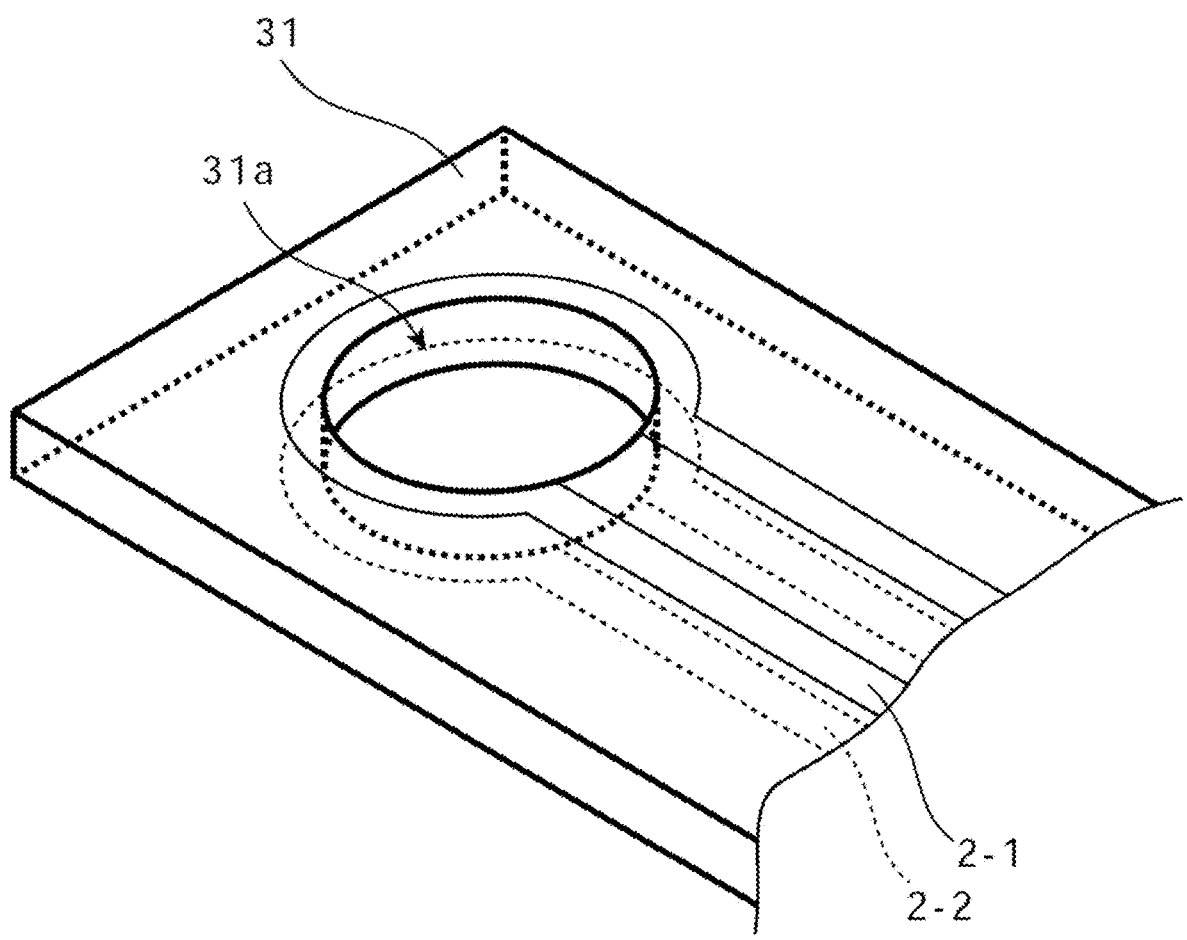
FIG. 10 is a schematic view that shows an example of a microwave generation unit 2 of a measurement device according to a fourth embodiment of the present invention.

FIG. 10 is a schematic view that shows an example of the microwave generation unit 2 of the measurement device according to a fourth embodiment of the present invention. In the fourth embodiment, a coil part 2a is configured with two wiring patterns (metal patterns) 2-1 and 2-2 that are formed on the front and rear surfaces of the substrate (board) 31 having a predetermined thickness. Specifically, the two wiring patterns are parallel to each other. Further, a through hole 31a that penetrates a center of the coil part 2a is provided in the substrate 31. Further, when the substrate (board) 31 is a multilayer substrate (board), the coil part 2a may be configured with two wiring patterns (metal patterns) that are parallel to each other and that are formed on or in different surfaces or layers different from each other of the multilayer substrate (board). Although an additional electrostatic capacitance member 2b is not shown in FIG. 10, the additional electrostatic capacitance member 2b is also provided. For instance, the same electrostatic capacitance element as the electrostatic capacitance element 2e (See FIG. 7 and the second embodiment) is mounted on the substrate (board) 31 and is electrically connected to the coil part 2a.

Explanations with respect to other configurations and operations of the measurement device according to the fourth embodiment are omitted because they are the same as the first embodiment or the second embodiment. Thus, please refer to the first and second embodiments for the other configurations and operations of the measurement device according to the fourth embodiment.

Fifth Embodiment

Figure 11:
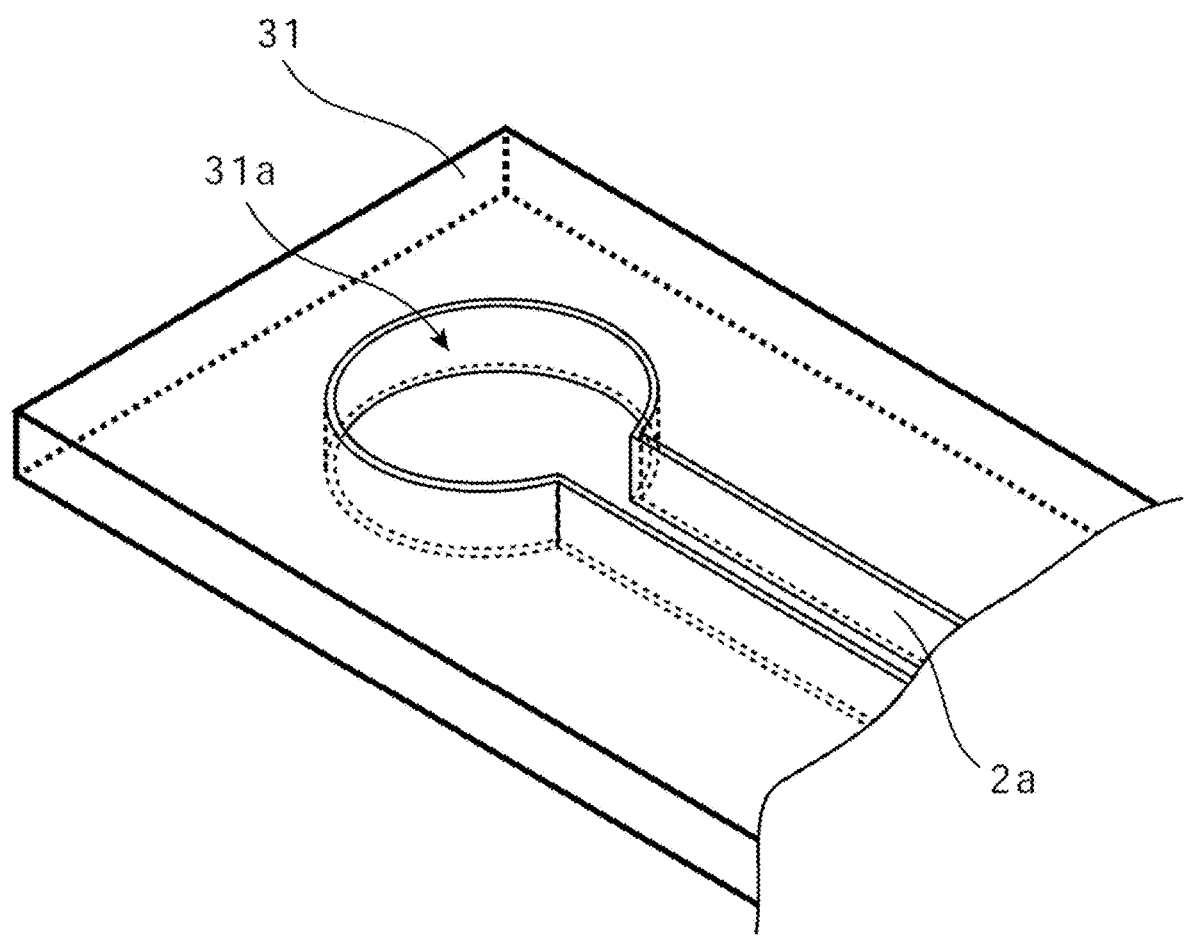
FIG. 11 is a schematic view that shows an example of a microwave generation unit 2 of a measurement device according to a fifth embodiment of the present invention.
Figure 12:
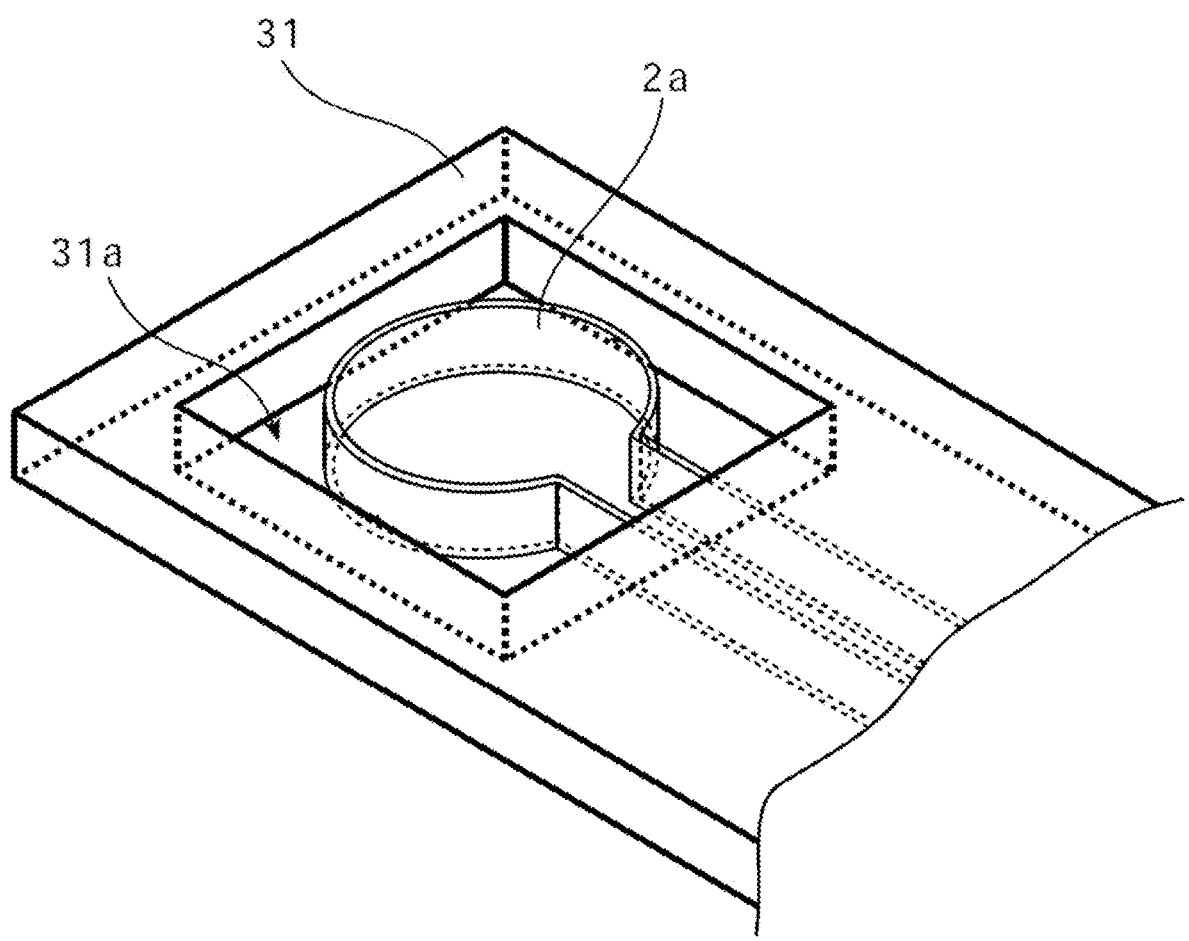
FIG. 12 is a schematic view that shows another example of the microwave generation unit 2 of the measurement device according to the fifth embodiment of the present invention.

FIGS. 11 and 12 are schematic views that show examples of the microwave generation unit 2 of the measurement device according to a fifth embodiment of the present invention. In the fifth embodiment, a through hole 31a is provided in the substrate (board) 31 having a predetermined thickness. Further, a coil part 2a as a plate-shaped coil (sheet coil) is provided in the through hole 31a. Specifically, the plate-shaped coil part 2a is disposed on an inner wall (surface) of the through hole 31a and on an inner wall (surface) of a longitudinal cut-out extending from the through hole 31a. With respect to the example shown in FIG. 11, the through hole 31a is formed in a cylindrical shape and the coil part 2a is in contact with the inner wall (surface) of the through hole 31a. With respect to the example shown in FIG. 12, the through hole 31a is formed in a square (quadrangle) cylindrical shape and the coil part 2a is not in contact with the inner wall (surface) of the through hole 31a. In other words, the coil part 2a is spaced apart from the inner wall (surface) of the through hole 31a. Although an additional electrostatic capacitance member 2b is not shown in FIGS. 11 and 12, the additional electrostatic capacitance member 2b is also provided.

Explanations with respect to other configurations and operations of the measurement device according to the fifth embodiment are omitted because they are the same as the first embodiment or the second embodiment. Thus, please refer to the first and second embodiments for the other configurations and operations of the measurement device according to the fifth embodiment.

Further, according to the embodiments of the present invention, the electrostatic capacitance element 2e (such as a chip type capacitor) as the additional electrostatic capacitance member 2b can be mounted on the substrate (board) 31. Specifically, the electrostatic capacitance element 2e (such as a chip type capacitor) can be mounted on the wiring pattern on the substrate (board) 31.

Further, according to the embodiments of the present invention, the measurement target strength calculation unit 6b measures (specifies), for instance, the strength (intensity) of the magnetic field (as the physical quantity) in the measured field. However, the measurement target strength calculation unit 6b can measure (specify) the strength (intensity) of an electric field in the measured field instead.

In addition, the present invention can be applied, for instance, to the measurement device based on the optically detected magnetic resonance (ODMR).

The measurement device being thus described, it will be apparent that the same may be varied in many ways. Such variations are not to be regarded as a departure from the spirit and scope of the invention, and all such modifications as would be apparent to one of ordinary skill in the art are intended to be included within the scope of the following claims. Further, the above embodiments can be combined with each other and such combinations are not to be regarded as a departure from the spirit and scope of the invention.

What is claimed is:

1. A measurement device comprising:
   a microwave generator configured to generate a microwave, the microwave being configured for an electron spin quantum operation based on a Rabi oscillation, the microwave generator having:
      a coil configured to emit the microwave; and
      an electrostatic capacitance member electrically arranged in parallel to the coil;
   an electron spin resonance member to which the microwave is irradiated; and
   an observation system configured to measure a physical quantity in a measured field in response to a state of the electron spin resonance member when the electron spin resonance member is irradiated by the microwave,
   wherein the coil has first and second ends,
   first and second legs continuously extend from the first and second ends of the coil, respectively, and
   the first and second legs and a gap that is formed between the first and second legs are configured to perform as the electrostatic capacitance member.

2. The measurement device according to claim 1,
   wherein third and fourth legs continuously extend from the first and second ends of the coil, respectively, and
   the coil and the first, second, third, and fourth legs are configured by a monolithic conductive plate.

3. The measurement device according to claim 2, further comprising:
   a frequency adjuster that is electrically connected in series to the microwave generator,
   wherein the frequency adjuster is configured to adjust a frequency of the microwave to a predetermined frequency by restraining a frequency change of the frequency of the microwave due to the electrostatic capacitance member.

4. The measurement device according to claim 3,
   wherein the coil sandwiches the electron spin resonance member or is located at only one side of the electron spin resonance member, and the coil is configured to generate the microwave by flowing electronic currents that are parallel to each other at a predetermined distance.

5. The measurement device according to claim 2, wherein the coil sandwiches the electron spin resonance member or is located at only one side of the electron spin resonance member, and the coil is configured to generate the microwave by flowing electronic currents that are parallel to each other at a predetermined distance.

6. The measurement device according to claim 1, wherein the coil and the first and second legs are configured by a monolithic conductive plate.

7. The measurement device according to claim 6, further comprising:

a frequency adjuster that is electrically connected in series to the microwave generator, wherein the frequency adjuster is configured to adjust a frequency of the microwave to a predetermined frequency by restraining a frequency change of the frequency of the microwave due to the electrostatic capacitance member.

8. The measurement device according to claim 7, wherein the coil sandwiches the electron spin resonance member or is located at only one side of the electron spin resonance member, and the coil is configured to generate the microwave by flowing electronic currents that are parallel to each other at a predetermined distance.

9. The measurement device according to claim 6, wherein the coil sandwiches the electron spin resonance member or is located at only one side of the electron spin resonance member, and the coil is configured to generate the microwave by flowing electronic currents that are parallel to each other at a predetermined distance.

10. The measurement device according to claim 1, wherein the electrostatic capacitance member is a capacitor that is electrically connected to the coil.

11. The measurement device according to claim 10, further comprising:

a frequency adjuster that is electrically connected in series to the microwave generator, wherein the frequency adjuster is configured to adjust a frequency of the microwave to a predetermined frequency by restraining a frequency change of the frequency of the microwave due to the capacitor.

12. The measurement device according to claim 11, wherein the coil sandwiches the electron spin resonance member or is located at only one side of the electron spin resonance member, and the coil is configured to generate the microwave by flowing electronic currents that are parallel to each other at a predetermined distance.

13. The measurement device according to claim 10, wherein the coil sandwiches the electron spin resonance member or is located at only one side of the electron spin resonance member, and the coil is configured to generate the microwave by flowing electronic currents that are parallel to each other at a predetermined distance.

14. The measurement device according to claim 1, further comprising:

a frequency adjuster that is electrically connected in series to the microwave generator, wherein the frequency adjuster is configured to adjust a frequency of the microwave to a predetermined frequency by restraining a frequency change of the frequency of the microwave due to the electrostatic capacitance member.

15. The measurement device according to claim 14, wherein the coil sandwiches the electron spin resonance member or is located at only one side of the electron spin resonance member, and the coil is configured to generate the microwave by flowing electronic currents that are parallel to each other at a predetermined distance.

16. The measurement device according to claim 1, wherein the coil sandwiches the electron spin resonance member or is located at only one side of the electron spin resonance member, and the coil is configured to generate the microwave by flowing electronic currents that are parallel to each other at a predetermined distance.

* * * * *

UNITED STATES PATENT AND TRADEMARK OFFICE
CERTIFICATE OF CORRECTION

| | | |
|---|---|---|
| PATENT NO. | : 11,221,381 B2 | Page 1 of 1 |
| APPLICATION NO. | : 16/783847 | |
| DATED | : January 11, 2022 | |
| INVENTOR(S) | : Yuki Takemura et al. | |

It is certified that error appears in the above-identified patent and that said Letters Patent is hereby corrected as shown below:

On the Title Page

Please insert the following, Item (30):
--Foreign Application Priority Data
February 22, 2019 (JP) JP2019-031070--

Signed and Sealed this
Twenty-eighth Day of June, 2022

Katherine Kelly Vidal
*Director of the United States Patent and Trademark Office*